United States Patent
Liu et al.

(10) Patent No.: US 10,901,014 B1
(45) Date of Patent: Jan. 26, 2021

(54) ITERATIVE ALGORITHM TO ESTIMATE FUNDAMENTAL PHASOR AND FREQUENCY VALUES FOR A PMU CALIBRATOR BASED ON A GENERAL SIGNAL-FITTING MODEL

(71) Applicant: NORTH CHINA ELECTRIC POWER UNIVERSITY, Beijing (CN)

(72) Inventors: Hao Liu, Beijing (CN); Tianshu Bi, Beijing (CN); Sudi Xu, Beijing (CN)

(73) Assignee: North China Electric Power University, Beijing (CN)

( * ) Notice: Subject to any disclaimer, the term of this patent is extended or adjusted under 35 U.S.C. 154(b) by 0 days.

(21) Appl. No.: 17/077,374

(22) Filed: Oct. 22, 2020

Related U.S. Application Data

(63) Continuation of application No. 16/935,896, filed on Jul. 22, 2020, which is a continuation of application No. PCT/CN2020/094913, filed on Jun. 8, 2020.

(51) Int. Cl.
*G01R 19/25* (2006.01)

(52) U.S. Cl.
CPC ..... *G01R 19/2513* (2013.01); *G01R 19/2503* (2013.01)

(58) Field of Classification Search
CPC .. G01R 19/2513; G01R 19/25; G01R 21/133; G01R 31/086; G01R 25/00; G01R 29/02; Y04S 10/00; Y04S 40/20; H02J 2203/20; H02J 13/00002
USPC ............. 324/76.77; 702/58–64, 182, 186
See application file for complete search history.

(56) References Cited

U.S. PATENT DOCUMENTS

| | | | |
|---|---|---|---|
| 8,018,379 B1 * | 9/2011 | Sun | G01S 19/36 342/357.75 |
| 8,847,570 B1 * | 9/2014 | Bell | G05F 1/10 323/301 |
| 2010/0185336 A1 * | 7/2010 | Rovnyak | H02J 3/38 700/287 |
| 2011/0181467 A1 * | 7/2011 | Samavati | G01S 19/37 342/357.73 |
| 2014/0225626 A1 * | 8/2014 | Venkatasubramanian | G01R 19/2513 324/537 |
| 2015/0121160 A1 * | 4/2015 | Baone | G01D 3/028 714/746 |
| 2017/0244250 A1 * | 8/2017 | Sun | G06Q 50/06 |
| 2018/0217568 A1 * | 8/2018 | Parvania | G05B 13/048 |
| 2018/0348266 A1 * | 12/2018 | Yao | G01R 19/2513 |
| 2020/0106261 A1 * | 4/2020 | Kasztenny | H02H 1/003 |

OTHER PUBLICATIONS

Xu, S. et al., "A High-Accuracy Phasor Estimation Algorithm for PMU Calibration and Its Hardware Implementation" IEEE Transactions on Smart Grid, vol. 11, No. 4, Jul. 2020, pp. 3372-3383, Jul. 2020.

* cited by examiner

*Primary Examiner* — John E Breene
*Assistant Examiner* — Jeffrey P Aiello
(74) *Attorney, Agent, or Firm* — Hunton AK LLP

(57) ABSTRACT

A high-accuracy synchrophasor estimation algorithm for PMU calibration is disclosed. This method can construct a dynamic phasor fitting model. Then, an iterative solution algorithm based on nonlinear fitting can be used to estimate the phasor and frequency, which can include one parameter during the iterations. Moreover, a method is disclosed for calculating the ROCOF based on the least-squares method to improve the ROCOF dynamic accuracy.

1 Claim, 9 Drawing Sheets

(a) Amplitude characteristic  (b) Phase characteristic (a) Amplitude characteristic  (b) Phase characteristic

ITERATIVE ALGORITHM TO ESTIMATE FUNDAMENTAL PHASOR AND FREQUENCY VALUES FOR A PMU CALIBRATOR BASED ON A GENERAL SIGNAL-FITTING MODEL

TECHNICAL FIELD

The present disclosure relates to the field of synchrophasor estimation algorithm, in particular to a phasor estimation algorithm for PMU calibration.

BACKGROUND

Phasor measurement units (PMUs) have become one of the most effective dynamic monitoring instruments for power systems because of their synchronization and fast reporting rate. Therefore, PMUs have been widely deployed in high-voltage transmission lines, such as over 2500 PMUs in China and more than 2000 PMUs in United States of America. To ensure the validity of phasor data-based applications, such as fault location, event detection, and state estimation, the measurement performance of PMUs must be tested and calibrated. In 2012 and 2018, two PMUs in China, deployed without testing and calibration, measured phasor and frequency inaccurately under off-nominal frequency condition; this caused false alarms of low-frequency oscillation in main stations. Hence, testing and calibration of PMUs under static and dynamic conditions are key to ensuring their operation quality and valid applications.

SUMMARY

The present disclosure provides for a high-accuracy synchrophasor estimation algorithm (and system) for PMU calibration. This algorithm can construct a dynamic phasor fitting model. Then, an iterative solution algorithm based on nonlinear fitting can be used to estimate the phasor and frequency, which can include one parameter during the iterations. Moreover, the present disclosure describes calculating the rate-of-change-of-frequency ("ROCOF") based on the least-squares method to improve the ROCOF dynamic accuracy. In addition, in one example embodiment, use of a filter for suppressing interference signals is disclosed and a determination is made as to whether post-processing the predicted values is recommended. Simulations and experiments verify that the accuracy of a calibrator using the methods of the present disclosure is at least 30 times better than the requirements provided for PMUs in IEEE and China standards.

BRIEF DESCRIPTION OF THE DRAWINGS

In order to facilitate a fuller understanding of the present invention, reference is now made to the attached drawings. The drawings should not be construed as limiting the present invention, but are intended only to illustrate different aspects and embodiments of the invention.

DETAILED DESCRIPTION

Figure 1:
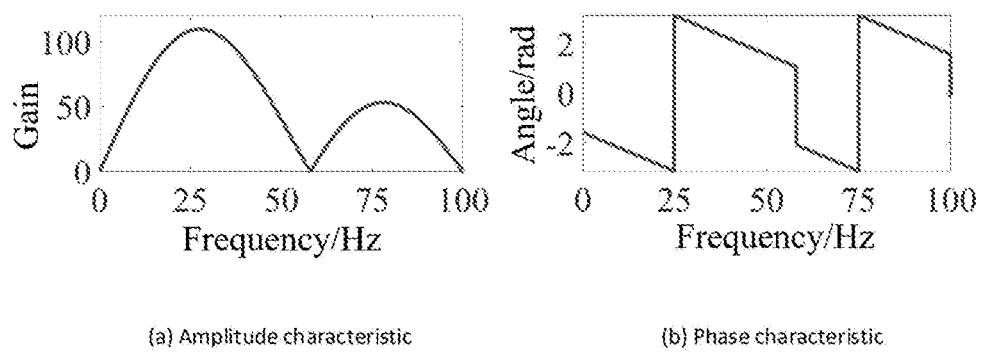
FIG. 1 shows spectrum characteristics for an example filter.

Exemplary embodiments of the invention will now be described in order to illustrate various features of the invention. The embodiments described herein are not intended to be limiting as to the scope of the invention, but rather are intended to provide examples of the components, use, and operation of the invention.

The latest PMU standard IEC/IEEE 60255-118-1 (hereafter called IEEE Std.) has been released and can be used to evaluate PMU performance in terms of the total vector error (TVE), frequency error (FE), and rate-of-change-of-frequency (ROCOF) error (RFE). The amplitude error (AE) and phase error (PE) are used to assess phasor errors instead of TVE in China (i.e., Chinese PMU standard, hereafter called CHN Std.), where error limitations are smaller than those in IEEE Std.

To obtain the measurement errors of PMU under test (DUT) reliably, reference measurements are necessary and their accuracy must be very high. In particular, the accuracy of reference measurements must be at least 10 times better than the requirements listed in PMU standards. There are two types of test systems used to provide reference measurements.

A testing platform can be based on a signal generator with high accuracy. The generator sends test signals specified in PMU standards to DUT and the reference values are obtained directly according to the mathematic models of the test signals. Thus, the generator must be high precision to ensure the uniformity of the test signals and reference values. However, it is difficult to guarantee the generator accuracy in some cases.

Another type of PMU testing platform can be based on a high-accuracy calibrator. The signal generator sends a test signal to the DUT and PMU calibrator simultaneously. Then, they estimate the phasor, frequency and ROCOF of the test signal. The measurements obtained by PMU calibrator are taken as the reference values to evaluate DUT performance. In this test system, the generator does not require such high precision, but the calibrator accuracy must be at least one order of magnitude better than the requirements.

The calibrator accuracy is determined by the hardware precision and estimation algorithm accuracy. The hardware errors are mainly from sample module and GPS time module. To ensure the calibrator is of high accuracy, the hardware errors must be tested and calibrated.

The phasor estimation method is vital to the calibrator accuracy. The phasor measurement algorithms can be categorized into two main types, which are the ones in frequency domain and the ones in time domain. Most of the frequency domain algorithms are based on discrete Fourier transform (DFT). A new two-term window, interpolated DFT (IpDFT), and enhanced-IpDFT algorithm (e-IpDFT) based on a static phasor model can be used to compensate the scalloping loss and effects of spectral interference. In addition, a novel phasor estimation method based on four- and six-parameter models, dynamic phasor estimation algorithm (DPEA), and interpolated dynamic DFT (IpD2FT) synchrophasor estimator can be used to establish a dynamic phasor model. These methods improve accuracy under dynamic conditions by combining DFT and complex Taylor expansion. Time domain algorithms include the weighted least-squares (WLS) method and its improved algorithms, Kalman filter methods, recursive algorithms, and dynamic phasor estimator based on the amplitude modulation (AM) and phase modulation (PM) model. These methods are also based on either a static or dynamic phasor model. Furthermore, some time-frequency approaches, such as empirical wavelet transform (EWT), can also be applied in phasor estimation. However, the above methods are for commercial PMUs. Their performance, especially frequency and ROCOF accuracy, cannot meet the calibration requirements under all the test scenarios of IEEE or CHN Std.

Since the test signal types can be known in advance and the calibrator has no real-time requirement in laboratory tests, a nonlinear fitting estimation algorithm can be used. That method establishes different signal fitting models for different test signals, and then uses iterative techniques to calculate the model parameters, resulting in a complex test bed setup. In addition, for some special test signals that are not included in PMU standards, such as multiple harmonics or modulation with multiple modulation frequencies, there are too many parameters to solve in the signal fitting models. Therefore, it is difficult to obtain signal parameters accurately. In another nonlinear fitting method, one-order or two-order polynomials can be used to fit the amplitude, phase and frequency of dynamic signals. However, there are multiple parameters that need to be solved in the fitting model. Thus, the issues of the fitting time, the fitting accuracy, the local convergence, and the calculation burden need to be considered. Universal estimation methods for the calibrator can measure arbitrary static and dynamic fundamental signals in real time. But the accuracy is not high enough for CHN Std. under off-nominal and dynamic conditions. Furthermore, the high-accuracy frequency or ROCOF estimation methods were not studied or provided in the above calibrator algorithms. Therefore, a universal and high-accuracy phasor, frequency and ROCOF estimation method that is valid for both IEEE and Chinese PMU calibration is needed.

This disclosure provides for an iterative algorithm to estimate fundamental phasor and frequency values for a PMU calibrator based on a general signal-fitting model that can obtain high-accuracy measurements under static and dynamic conditions. By revealing the relationship between the fundamental frequency and other parameters of the fitting model, only one parameter needs to be corrected iteratively during the fitting process, which improves accuracy and saves the calculation burden. Due to the inaccurate ROCOF obtained by the existing methods under modulation conditions, an ROCOF algorithm based on the filter spectrum characteristic analysis of the least-square (LS) method is described. Additionally, the present disclosure describes calibrator hardware suited for implementing the methods described herein. The uncertainty associated with this hardware is tested and analyzed. Then, the calibrator is verified by simulations and experiments including single and combined tests, where its performance is compared with that of three other estimation techniques and to the CHN and IEEE Std.

This disclosure will describe and compare the PMU performance requirements in IEEE and CHN Std. Additionally, a nonlinear-fitting-based reference phasor estimation algorithm and ROCOF correction method are described. Then, an interfering signal suppressing method and post-processing techniques for transient conditions are disclosed. Furthermore. the implementation procedure of this algorithm and the hardware selection and tests of the built PMU calibrator are described. Lastly, the performance of these methods and the calibrator implementing them is compared with other estimation algorithms.

IEEE and CHN Standards

Table I lists the PMU performance requirements in CHN and IEEE Std. under static and dynamic conditions, where AM and PM means amplitude and phase modulation. It can be observed that there are no requirements for the measurement errors in combined amplitude and phase modulation tests (AM+PM) or RFE in harmonic distortion tests in IEEE Std. One harmonic overlies the fundamental frequency for harmonic tests in IEEE Std., but test signals must contain multiple harmonics in CHN Std. Besides, except off-nominal test, the fundamental frequency is nominal frequency for other tests in IEEE Std., but the fundamental frequency deviates from 50 Hz to 49.5 Hz or 50.5 Hz under interference and dynamic conditions in CHN Std. The measurement error limitations of CHN Std. are smaller than those of IEEE Std., which increases the difficulty in developing a PMU calibrator.

TABLE I

PERFORMANCE REQUIREMENTS IN
IEEE AND CHN STANDARDS

| Test types | CHN | | | | IEEE | | |
| --- | --- | --- | --- | --- | --- | --- | --- |
| | AE (%) | PE (°) | FE (Hz) | RFE (Hz/s) | TVE (H) | FE (Hz) | RFE (Hz/s) |
| Off-nominal | 0.2 | 0.2 | 0.002 | 0.01 | 1 | 0.005 | 0.1 |
| Harmonics | 0.4 | 0.4 | 0.004 | 0.02 | 1 | 0.025 | N/A |
| Out-of-band (OOB) | 0.5 | 1 | 0.025 | N/A | 1.3 | 0.01 | N/A |
| AM | 0.2 | 0.3 | 0.025 | 0.1 | 3 | 0.3 | 14 |
| PM | 0.2 | 0.5 | 0.3 | 3 | 3 | 0.3 | 14 |
| AM + PM | 0.2 | 0.5 | 0.3 | 3 | N/A | N/A | N/A |
| Frequency ramp | 0.2 | 0.5 | 0.01 | 0.2 | 1 | 0.01 | 0.2 |

Reference Synchrophasor Estimation Algorithm

A. Phasor and Frequency Estimation

1. General Phasor Fitting Model

An amplitude modulation (AM) signal model can be used to estimate the measurements under static and dynamic conditions, even for signals with nonlinear and time-varying phase. For example, third order polynomials are applied to fitting the time-varying amplitude, and the phasor model can be obtained as follows:

$$x(t) = \sqrt{2} X(t) \cdot \cos(2\pi f_n t + \varphi_0) \quad (1)$$
$$\approx \sqrt{2} (a_0 + a_1 t + a_2 t^2 + a_3 t^3) \cdot \cos(2\pi f_n t + \varphi_0)$$
$$= \sqrt{2} \sum_{i=0}^{3} a_i t^i \cos(2\pi f_n t + \varphi_0)$$

where x(t) denotes the nonlinear amplitude, $f_n$ is the nominal frequency, $\varphi_0$ is the initial phase, and $a_i$ ($0 \le i \le 3$) are the polynomial coefficients. This method considers that the signal distortion, which is caused by the nonlinear change of amplitude or phase, only results from the nonlinear changing amplitude in a short data window. The frequency and initial phase are regarded as constants simultaneously.

When the fundamental frequency deviates from nominal frequency, larger measurement errors may be generated under off-nominal and dynamic conditions. Therefore, the general phasor fitting model in (1) can be rewritten as:

$$x(t) \approx \sqrt{2} \sum_{i=0}^{3} a_i t^i \cos(2\pi f_0 t + \varphi_0) \quad (2)$$
$$= \sqrt{2} \sum_{i=0}^{3} [a_i \cos\varphi_0 \cdot t^i \cos(2\pi f_0 t) - a_i \sin\varphi_0 \cdot t^i \sin(2\pi f_0 t)]$$

where $f_0$ is the fundamental frequency.

The unknown parameters in the fitting model are $a_i$ ($0 \le i \le 3$), $f_0$, and $\varphi_0$. If $f_0$ is known, then $t^i \cos(2\pi f_0 t)$ and $t^i \sin(2\pi f_0 t)$ can be calculated; x(t) is the known signal sampling values. If $a_i \cos \varphi_0$ and $a_i \sin \varphi_0$ are taken as unknowns as a whole, there will be 8 unknowns. Thus, as long as at least 8 equations are constructed, then $a_i \cos \varphi_0$ and $a_i \sin \varphi_0$ can be calculated. Then, $a_i$ ($0 \le i \le 3$) and $\varphi_0$ can be obtained according to the trigonometric function relation. Therefore, for the fitting model in (2), once the signal frequency in the data window is obtained, the amplitude and phase can be calculated correspondingly. An iterative technique is used to accurately obtain the fundamental frequency.

2. Iterative Estimation Method

The nonlinear fitting model in (2) must be linearized to solve parameters. Through iterations based on the linearized model, $f_0$ is continuously updated to approximate the real frequency in the data window. After obtaining the frequency, the phasor can be calculated accordingly.

In (2), $a_i \cos \varphi_0$ and $a_i \sin \varphi_0$ need to be solved. To facilitate the derivation, let $c_i = a_i \cos \varphi_0$ and $s_i = -a_i \sin \varphi_0$. Thus, (2) can be simplified as:

$$x(t) \approx \sum_{i=0}^{3} c_i t^i \cdot \cos 2\pi f_0 t + s_i t^i \cdot \sin 2\pi f_0 t \quad (3)$$

The first-order Taylor series expansion of x(t) is carried out to realize linearization; x(t) can be expressed as:

$$x(t) \approx x(t, f_0) + \frac{\partial x(t, f_0)}{\partial f_0} \Delta f_0 \quad (4)$$

where $$\frac{\partial x(t, f_0)}{\partial f_0} = \sum_{i=0}^{3} [c_i t^i \cdot 2\pi t(-\sin 2\pi f_0 t) + s_i t^i \cdot 2\pi t \cos 2\pi f_0 t] \quad (5)$$
$$= \sum_{i=0}^{3} [2\pi c_i t^{i+1} \cdot (-\sin 2\pi f_0 t) + 2\pi s_i t^{i+1} \cdot \cos 2\pi f_0 t]$$

Equations (3) and (5) are then substituted into (4), from which $$x(t) \approx c_0 \cdot C(t, f_0) + s_0 \cdot S(t, f_0) \quad (6)$$
$$+ \sum_{i=1}^{3} [(c_i + 2\pi s_i \Delta f_0) t^i \cdot C(t, f_0)$$
$$+ (s_i - 2\pi c_i \Delta f_0) t^i \cdot S(t, f_0)]$$
$$+ 2\pi s_i \Delta f_0 \cdot t^4 \cdot C(t, f_0) - 2\pi c_i \Delta f_0 \cdot t^4 \cdot S(t, f_0)$$

where $C(t, f_0) = \cos(2\pi f_0 t)$ and $S(t, f_0) = \sin(2\pi f_0 t)$.

Setting the time tag of measurements in the center of the data window can improve measurement accuracy. Therefore, the following time vector is constructed to measure the signal in the data window.

$$t = [-N/f_s, -(N-1)/f_s, \ldots, 0, \ldots, (N-1)/f_s, N/f_s]^T \quad (7)$$
$$= [t_0, t_1, \ldots, t_N, \ldots, t_{2N-1}, t_{2N}]^T$$

where $f_s$ is the sampling rate, N is a positive integer, and the observation length $T_L = (2N+1)/f_s$ accordingly. In one example embodiment, the observation length is two cycles ($T_L = 0.04s$).

t is then substituted into (6), giving $$x(t) = P \cdot H \quad (8)$$

where x(t) is the sample values in the observation window, whose size is (2N+1)×1; P is a matrix related to time and $f_0$ to be iterated, whose size is (2N+1)×10; and H is composed of variables to be solved ($c_i$, $s_i$, and the correction $\Delta f_0$ of $f_0$), whose size is 10×1. P and H are defined as follows:

$$H = [c_0, s_0, \ldots, c_i + 2\pi s_i \Delta f_0, s_i - 2\pi c_i \Delta f_0, \ldots 2\pi s_3 \Delta f_0, -2\pi c_3 \Delta f_0]^T \quad (9)$$

$$P = \begin{bmatrix} C(t_0, f_0) & S(t_0, f_0) & \ldots & t_0^4 \cdot C(t_0, f_0) & t_0^4 \cdot S(t_0, f_0) \\ C(t_1, f_0) & S(t_1, f_0) & \ldots & t_1^4 \cdot C(t_1, f_0) & t_1^4 \cdot S(t_1, f_0) \\ \vdots & \vdots & \ddots & \vdots & \vdots \\ C(t_{2N-1}, f_0) & S(t_{2N-1}, f_0) & \ldots & t_{2N-1}^4 \cdot C(t_{2N-1}, f_0) & t_{2N-1}^4 \cdot S(t_{2N-1}, f_0) \\ C(t_{2N}, f_0) & S(t_{2N}, f_0) & \ldots & t_{2N}^4 \cdot C(t_{2N}, f_0) & t_{2N}^4 \cdot S(t_{2N}, f_0) \end{bmatrix} \quad (10)$$

In (8), x(t) is the known sample values. The $f_0$ is known at each iteration; hence, P can be calculated by (10) (As the fundamental frequency is in the proximity of the nominal frequency $f_n$, the initial point of $f_0$ is set as $f_n$ in the first iteration). Therefore, H can be solved by the weighted least squares (WLS) method:

$$H = (P^T W^T W P)^{-1} P^T W^T W x(t) \quad (11)$$

where $W = \text{diag}[w(-N), w(-N+1), \ldots, w(0), \ldots, w(N-1), w(N)]$ is the diagonal matrix formed by the adopted window $w(\cdot)$ such as Hann window, and it can improve anti-interference capability.

The correction $\Delta f_0$ of $f_0$ in each iteration is dependent on H and requires a further solution. The first four elements of the matrix H are $$H(1) = c_0 = a_0 \cos \varphi_0 \quad (12)$$

$$H(2) = s_0 = a_0 \sin \varphi_0 \quad (13)$$

$$H(3) = c_1 + 2\pi s_0 \Delta f_0 = a_1 \cos \varphi_0 - 2\pi \Delta f_0 \cdot a_0 \sin \varphi_0 \quad (14)$$

$$H(4) = s_1 - 2\pi c_0 f_0 = -a_1 \sin \varphi_0 - 2\pi \Delta f_0 \cdot a_0 \cos \varphi_0 \quad (15)$$

H(1) to H(4) thus satisfy the following relationship:

$$\begin{aligned} H(2) \cdot H(3) - H(1) \cdot H(4) &= \\ 2\pi s_1^2 \cdot \Delta f_0 + c_1 \cdot s_0 - (-2\pi c_1^2 \cdot \Delta f_0 + s_1 \cdot c_0) &= \\ 2\pi (c_1^2 + s_1^2) \cdot \Delta f_0 + c_1 \cdot s_0 - s_1 \cdot c_0 &= \\ 2\pi (H(1)^2 + H(2)^2) \cdot \Delta f_0 + (-a_0 a_1 \cos\varphi_0 \sin\varphi_0) - \\ (-a_0 a_1 \cos\varphi_0 \sin\varphi_0) &= 2\pi [H(1)^2 + H(2)^2] \cdot \Delta f_0 \end{aligned} \quad (16)$$

As such, the frequency correction is $$\Delta f_0 = \frac{H(2) \cdot H(3) - H(1) \cdot H(4)}{2\pi [H(1)^2 + H(2)^2]} \quad (17)$$

Therefore, the frequency correction can be obtained by using equation (17). Then, the new frequency $f_0'$, is updated by $f_0' = f_0 + \Delta f_0$. $f_0'$ can now be brought into (10) to update P, and $\Delta f_0$ can be recalculated by equations from (11) to (17). These steps are repeated until $|\Delta f_0| \le \varepsilon$ ($\varepsilon$ is a small positive number and it is $10^{-6}$ in this paper).

When the iteration terminates, the time scale is set in the center of the observation window. Thus, the phasor $\dot{x}$ can be obtained by $$\dot{X} = H(1) - jH(2) = a_0 \cos\varphi_0 + ja_0 \sin\varphi_0 \quad (18)$$

The frequency of the signal in the data window is $f_0'$ obtained by the last iteration. Simulation results indicate that the above iterative method can obtain accurate measurements after two or three iterations.

B. ROCOF Estimation

1. Conventional ROCOF Estimation Method

A second-order polynomial can be used to approximate the time-varying frequency in the observation window, which can be represented as:

$$f(t) = d_0 + d_1 t + d_2 t^2 \quad (19)$$

where $d_0$, $d_1$, and $d_2$ are polynomial coefficients. The matrix form of (19) is $$F = \begin{bmatrix} f(t_0) \\ f(t_1) \\ \vdots \\ f(t_M) \end{bmatrix} = \begin{bmatrix} 1 & t_0 & t_0^2 \\ 1 & t_1 & t_1^2 \\ \vdots & \vdots & \vdots \\ 1 & t_M & t_M^2 \end{bmatrix} \begin{bmatrix} d_0 \\ d_1 \\ d_2 \end{bmatrix} = P_f D \quad (20)$$

where F consists of M+1 adjacent frequencies measured by the above iterative method, D is a matrix composed of polynomial coefficients, $P_f$ is related to discrete time, and $$[t_0, t_1, \ldots, t_M] = \left[ -\frac{M/2}{F_c}, \frac{(M-1)/2}{F_c}, \ldots, 0, \ldots, \frac{(M-1)/2}{F_c}, \frac{M/2}{F_c} \right] \quad (21)$$

where M is an even number and $F_c$ is the calculation rate.

Thus, the polynomial coefficients can be obtained by LS method:

$$D = (P_f^T P_f)^{-1} P_f^T F \quad (22)$$

By deriving (19) and setting the time tag in the center of the observation window, ROCOF can be calculated to be $d_1$.

2. Improved ROCOF Estimation Method

The above method can estimate ROCOF accurately in the steady state, but cause larger errors in the existence of power system oscillation. Therefore, an error correction method is proposed to improve the ROCOF measurement accuracy under dynamic conditions.

The frequency and ROCOF of power oscillation can be expressed as:

$$f(t) = f_0 - a_m \sin(2\pi f_m t + \varphi_p) \quad (23)$$

$$rf(t) = -b_m a_m \cos(2\pi f_m t + \varphi_p) \quad (24)$$

where $a_m = -f_m k_p$, $b_m = 2\pi f_m$, $k_p$ is the phase modulation depth, and $\varphi_p$ is the modulation initial phase.

In (22), let $$Q_f = (P_f^T P_f)^{-1} P_f^T = \begin{bmatrix} q_{00} & q_{01} & \cdots & q_{0M} \\ q_{10} & q_{11} & \cdots & q_{1M} \\ q_{20} & q_{21} & \cdots & q_{2M} \end{bmatrix} = \begin{bmatrix} q_0 \\ q_1 \\ q_2 \end{bmatrix} \quad (25)$$

When $F_c$ and $M$ are determined, $P_f$ and $Q_f$ can be calculated offline. Since ROCOF is equal to $d_1$ in the observation window, its estimation equation can be rewritten as $$\hat{rf}(k) = \sum_{i=0}^{M} q_{1i} f(k - M/2 + i) \quad (26)$$

Equation (26) is equivalent to using $M$ order filter $q_1 = [q_{10}, q_{10}, \ldots, q_{1M}]$ to filter the measured frequencies.

FIG. 1 shows an example spectrum characteristics for an example filter. In this example, the spectrum characteristics of filter $q_1$ are shown in ($F_c$=200 Hz, $M$=4). The filter gain for DC component (0 Hz) is 0, which indicates that for the steady fundamental frequency, the obtained ROCOF is 0; the phase delay is $(-M/2 \cdot 2\pi f_m - \pi/2)$, where the linear phase delay $(-M/2 \cdot 2\pi f_m)$ can be eliminated by setting the time tag in the center of the data window, but the phase delay $(-\pi/2)$ may cause the phase difference $\pi/2$ between the frequency and ROCOF obtained by the filter $q_1$.

The amplitude-frequency characteristic of $q_1$ is denoted by $|H_f(f)|$, and thus the estimated ROCOF in the time domain can be expressed as (27) after filtering frequencies in (23).

$$\hat{rf}(t) = |H_f(f_m)| \cdot a_m \sin(2\pi f_m t + \varphi_p + \frac{\pi}{2}) \quad (27)$$

$$= |H_f(f_m)| \cdot a_m \cos(2\pi f_m t + \varphi_p)$$

Then, ROCOF measurement errors can be expressed as $$e_{rf}(t) = rf(t) - \hat{rf}(t) \quad (28)$$

$$= (b_m - |H_f(f_m)|) \cdot a_m \cos(2\pi f_m t + \varphi_p)$$

$$= \left( \frac{b_m}{|H_f(f_m)|} - 1 \right) \cdot |H_f(f_m)| a_m \cos(2\pi f_m t + \varphi_p)$$

The errors are determined by the modulation frequency $f_m$. If $e_{rf}(t)$ can be obtained, the ROCOF errors may be eliminated.

Using a two-order polynomial to fit the estimated ROCOF, which is equivalent to utilizing filter $q_2$ in (25) to filter the ROCOF in (27), the second derivative of ROCOF can be deduced as $$c_2(k) = \sum_{i=0}^{M} q_{2i} \hat{rf}(k - M/2 + i) \quad (29)$$

Figure 2:
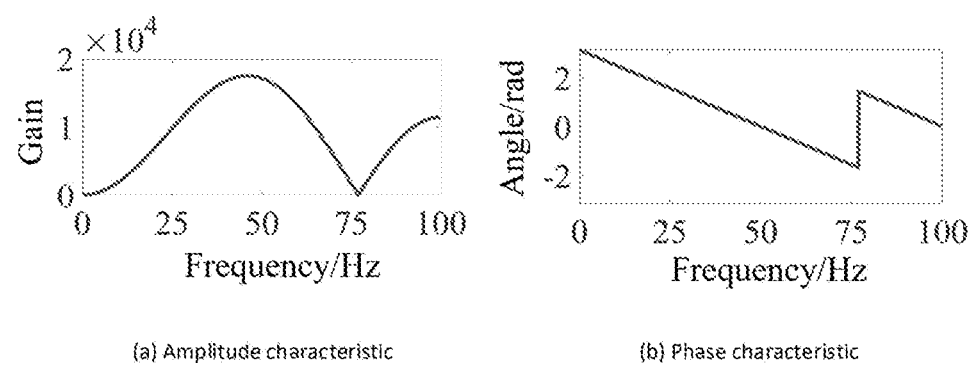
FIG. 2 shows spectrum characteristics for another example filter.

FIG. 2 shows an example spectrum characteristics for another example filter. In this example embodiment, the spectrum characteristic of $q_2$ is depicted. Due to the phase delay $(-M/2 \cdot 2\pi f_m + \pi)$ in the low-frequency band, the expression of the second derivative in the time domain is $$c_2(t) = |H_2(f_m)||H_f(f_m)| \cdot a_m \cos(2\pi f_m t + \varphi_p - \pi) \quad (30)$$

$$= -|H_2(f_m)||H_f(f_m)| \cdot a_m \cos(2\pi f_m t + \varphi_p)$$

where $|H_2(f)|$ denotes the amplitude-frequency characteristic of $q_2$. Substitute (30) into (28), the ROCOF measurement error can be rewritten as $$e_{rf}(t) = \left( \frac{b_m}{|H_f(f_m)|} - 1 \right) \cdot \frac{c_2(t)}{|H_2(f_m)|} \quad (31)$$

Let $$K_2 = \left( \frac{b_m}{|H_f(f_m)|} - 1 \right) \cdot \frac{1}{|H_2(f_m)|} \quad (32)$$

Figure 3:
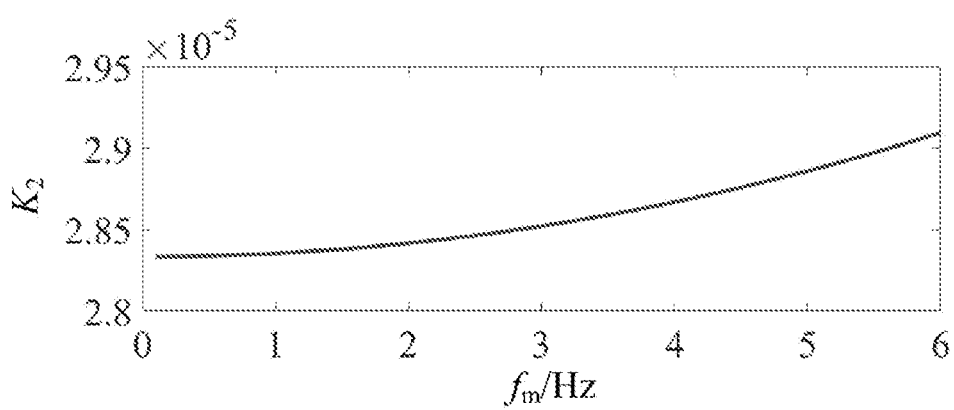
FIG. 3 shows an example relationship between ROCOF measurement errors and modulation frequency.

FIG. 3 shows the relationship between ROCOF measurement errors and modulation frequency according to an example embodiment. In this example embodiment, the relationship between $K_2$ and $f_m$ is displayed. The change of $K_2$ with modulation frequency is very small. The minimum and maximum values are $2.83 \times 10^{-5}$ and $2.91 \times 10^{-5}$ respectively, and the difference is $8 \times 10^{-7}$. Therefore, $K_2$ can be considered as a constant independent of modulation frequency (The constant is set as $2.85 \times 10^{-5}$ in this paper). The measurement error is approximately equal to multiplying the second derivative of ROCOF and $2.85 \times 10^{-5}$, and then it can be eliminated as follows:

$$\hat{rf}_c(k) = \hat{rf}(k) - 2.85 \times 10^{-5} c_2(k) \quad (33)$$

where $\hat{rf}_c(k)$ is the final ROCOF.

C. Interference Suppression

Figure 4:
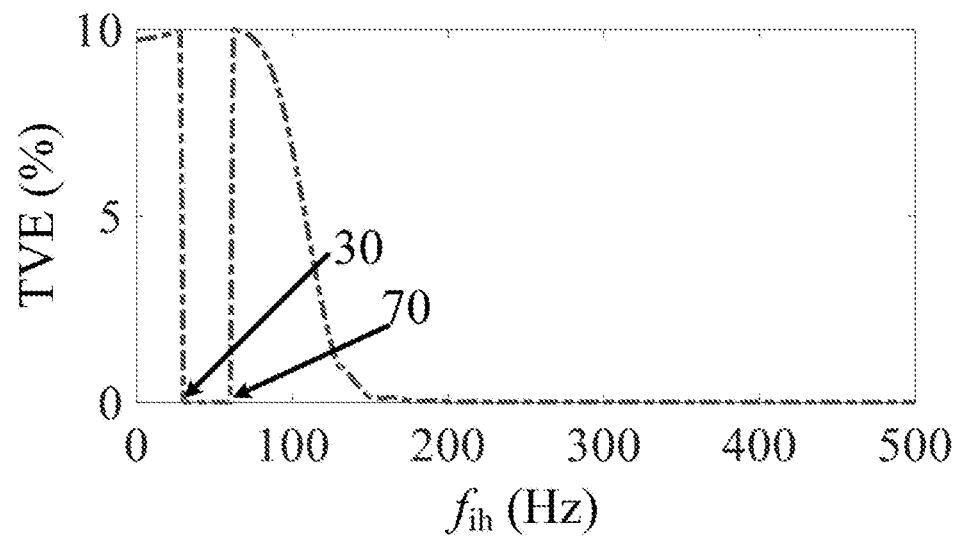
FIG. 4 shows example phasor errors resulting from harmonics and inter-harmonics.

FIG. 4 shows example phasor errors resulting from harmonics and inter-harmonics. In this example embodiment, the influence of harmonics and inter-harmonics on the fundamental phasor are displayed, where the interference magnitudes are the 10% of the fundamental magnitude and interference frequencies are 0 Hz~30 Hz and 70 Hz~500 Hz. The phasor errors decrease from 10% to 0.0001% with the increase of the frequencies of harmonics or inter-harmonics. Therefore, the methods of the present disclosure have a better high-frequency interference suppression effect. But it is sensitive to the low-frequency interferences. Therefore, a high order finite impulse response (FIR) band-pass filter is applied to reject the low-frequency interferences in the test signals.

Figure 5:
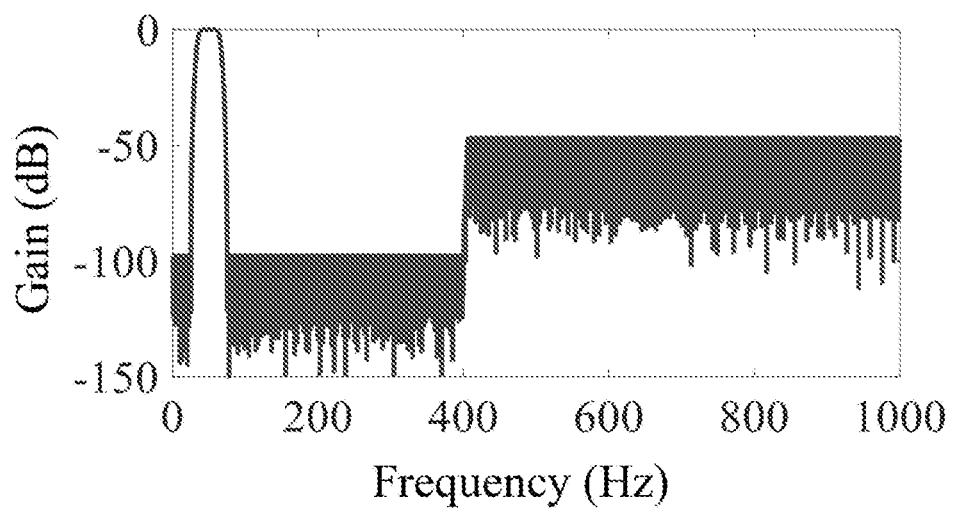
FIG. 5 shows an example amplitude-frequency characteristic of a band-pass filter.

FIG. 5 shows an example amplitude-frequency characteristic of a band-pass filter. The stopband and passband of the band-pass filter is determined by the reporting rate $F_r$. To avoid frequency aliasing, the interference signals of 0 Hz~$(f_n - F_r/2)$ Hz and greater than $(f_n + F_r/2)$ Hz must be removed. In this example, $F_r$=50 Hz, so the stopband is set as less than 25 Hz and more than 75 Hz, and the passband is 42 Hz~58 Hz. The filter order is 3000 ($f_s$=10 kHz in this example) and its amplitude-frequency characteristic is displayed in FIG. 5. Due to the high-frequency suppression effect of this estimation method, the stopband gain in the low-frequency band (0 Hz~25 Hz and 75 Hz~400 Hz) is less than that in the frequency band over 400 Hz. This design method has a better low-frequency suppression effect for the same filter order. The low-frequency gain is less than −98 dB, resulting in good suppression on interferences. In addition, the pass-band gain is between −0.0001 dB and 0.0001 dB, leading to little influence on the fundamental phasor.

D. Step Post-Processing

Due to the usage of the band-pass filter, the response time and delay time may be long during the step process. This delay may prevent the estimated measurements from being set as the reference values to test DUT in step tests. Therefore, a post-processing method is disclosed to solve this problem.

A "transient monitor" is used to represent the quality of the measured phasor, and it can be expressed as:

$$E_{res} = \sum_{i=0}^{2N} |x(i) - \hat{x}(i)| \qquad (34)$$

where $E_{res}$ denotes the "transient monitor", $x(i)$ are the sampled values, and $\hat{x}(i)$ are the estimated values, obtained by:

$$\hat{x}(i) = \sqrt{2}\hat{X}_m \cos(2\pi \hat{f}_0 t_i + \hat{\varphi}_0) \qquad (35)$$

where $\hat{X}_m$, $\hat{f}_0$ and $\hat{\varphi}_0$ are the measured amplitude, frequency and initial phase.

Figure 6:
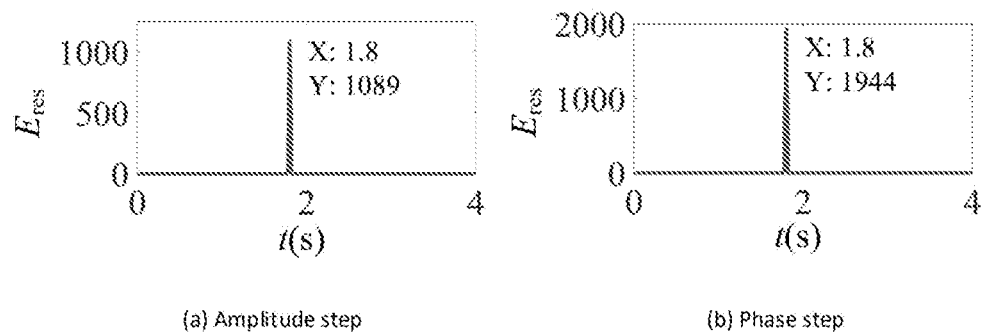
FIG. 6 shows example "transient monitor" values indicating amplitude and phase steps.

FIG. 6 shows example "transient monitor" values indicating amplitude and phase steps. In one example, the test signal is steady-state before and after the steps (23) and (24), and thus the above method is utilized to determine the step time (denoted by $t_s$). For a 4s test signal, the amplitude step and phase step happen at 1.8s, where amplitude step size is 10% of nominal amplitude and phase step size is π/18. The "transient monitor" is shown in FIG. 6. At the step time $t_s$, $E_{res}$ has the maximum value and is greater than 1000. Based on this feature, the step time can be determined.

Figure 7:
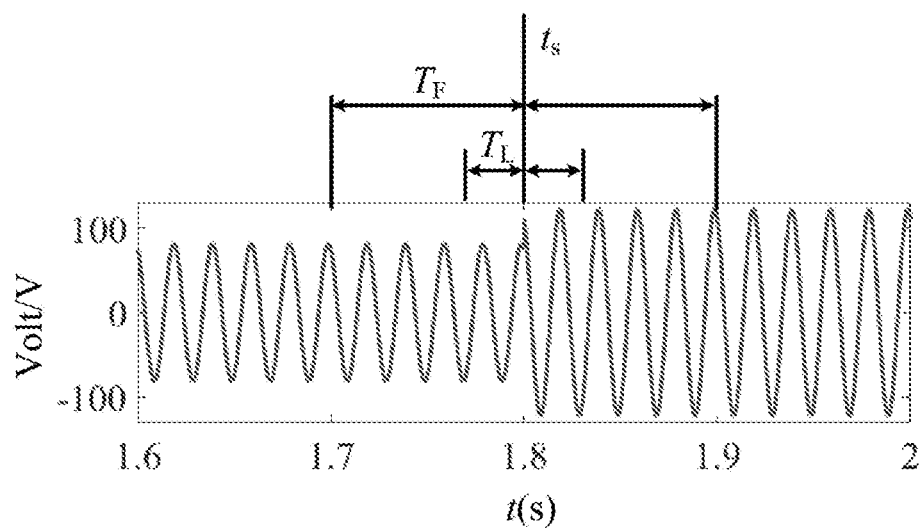
FIG. 7 shows an example filter window and phasor estimation window during a step process.

FIG. 7 shows an example filter window and phasor estimation window during a step process. As shown in FIG. 7, the delay time and response time suffer from the filter length (denoted by $T_F$) and phasor estimation window length $T_L$, so the measured values between $t_s - T_F$ and $t_s + T_F$ must be post-processed after determining the step time. To avoid the influence of the band-pass filter, the measurements are recalculated by using the unfiltered test signals in the section $[t_s - T_F, t_s + T_F]$, and replace the measured values obtained by the filtered signals. To eliminate the influence of the phasor estimation window length, the signal model (shown in (1)) in $[t_s - T_L, t_s]$ can be established by using the iterative estimation method to estimate the unfiltered signal, and thus the measurements at any time in $[t_s - T_L, t_s]$ can be calculated. Then, the measurements at the reporting time in $[t_s - T_L, t_s]$ replace the initial measurements. For the section $[t_s, t_s + T_L]$, the post process is the same. Based on these processes, the measurement response delay can be eliminated.

Implementation of the PMU Calibrator

A. Software Implementation

Figure 8:
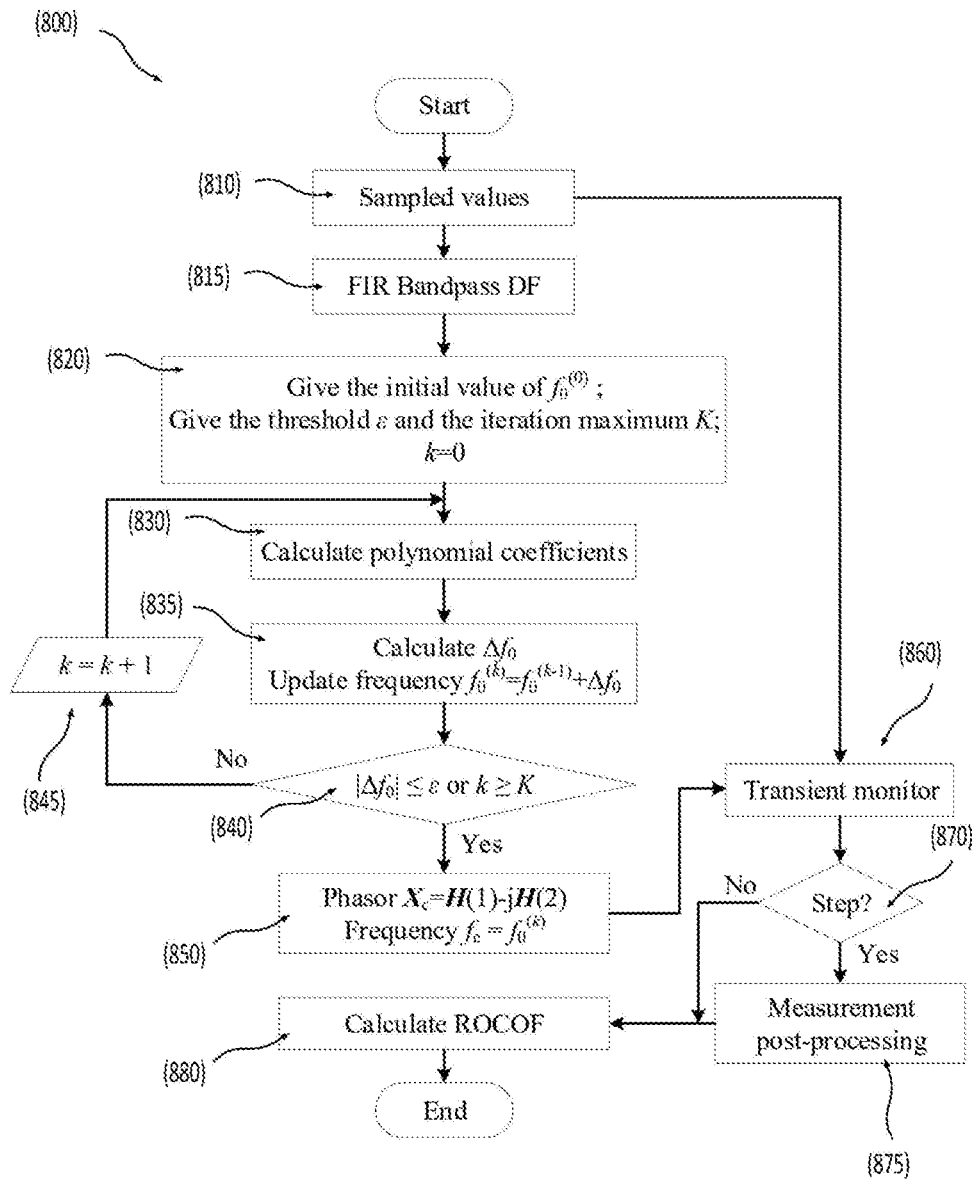
FIG. 8 shows an example flow chart for a phasor estimation algorithm according to an example embodiment.

FIG. 8 shows an example flow chart 800 for a phasor estimation algorithm according to an example embodiment. The flow chart 800 includes exemplary steps for the phasor estimation algorithm. One of ordinary skill in the art recognizes that one may exercise the methods disclosed herein even when some of the listed steps are excluded or some additional steps are added to the flow chart 800.

The exemplary steps of the algorithm 800 can be performed by a processor of a PMU calibrator device (or "device"). In this example embodiment, in step 810 the device can synchronously sample test signals including a voltage signal and a current signal. For each test signal, the device can obtain the amplitude, phase, frequency and ROCOF. The device can provide the sampling values of the test signals to a filter (step 815) and a quality control module (step 860).

In step 815, the device can apply a high order finite impulse response (FIR) digital band-pass filter to the sampling values of the test signals. The phasor estimation algorithm of the present disclosure can suppress high-frequency interferences, and thus, the (FIR) band-pass filter may reject the low-frequency interferences in the test signals.

In step 820, one or more threshold values can be set for the device. For example, the initial value of a fundamental frequency $f_0$ can be set. In one example embodiment, the value of the fundamental frequency can be close to the nominal frequency $f_n$, and thus, the initial value of $f_0$ can be set as $f_n$ in the first iteration. As another example, one can specify how much to calibrate or refine the phasor and/or frequency of the PMU by setting a threshold value e for frequency correction. The frequency correction method of the present disclosure can be repeated and recalculated until $|\Delta f_0|$ is less than the threshold value e. Additionally (or alternatively), one can specify a minimum and/or maximum number of iterations K for the frequency method to be repeated and recalculated. For this purpose, a counter k can be used, which can be set to zero in this step.

In step 830, a set of polynomial coefficients can be calculated for the phasor estimation algorithm. For example, a phasor model can be defined as:

$$x(t) = P \cdot H \qquad (8)$$

where $x(t)$ is the sample values in the observation window, whose size is $(2N+1)\times 1$; $P$ is a matrix related to time and $f_0$ to be iterated, whose size is $(2N+1)\times 10$; and H is composed of variables to be solved, whose size is $10\times 1$. P and H are defined as follows:

$$H = [c_0, s_0, \ldots, c_i + 2\pi s_i \Delta f_0, s_i - 2\pi c_i \Delta f_0, \ldots, 2\pi s_3 \Delta f_0, -2\pi c_3 \Delta f_0]^T \qquad (9)$$

$$P = \begin{bmatrix} C(t_0, f_0) & S(t_0, f_0) & \ldots & t_0^4 \cdot C(t_0, f_0) & t_0^4 \cdot S(t_0, f_0) \\ C(t_1, f_0) & S(t_1, f_0) & \ldots & t_1^4 \cdot C(t_1, f_0) & t_1^4 \cdot S(t_1, f_0) \\ \vdots & \vdots & \ddots & \vdots & \vdots \\ C(t_{2N-1}, f_0) & S(t_{2N-1}, f_0) & \ldots & t_{2N-1}^4 \cdot & t_{2N-1}^4 \cdot \\ & & & C(t_{2N-1}, f_0) & S(t_{2N-1}, f_0) \\ C(t_{2N}, f_0) & S(t_{2N}, f_0) & \ldots & t_{2N}^4 \cdot C(t_{2N}, f_0) & t_{2N}^4 \cdot S(t_{2N}, f_0) \end{bmatrix} \qquad (10)$$

In this example, in step 830, the device can calculate the H by the weighted least squares (WLS) method:

$$H = (P^T W^T W P)^{-1} P^T W^T W x(t) \qquad (11)$$

where $W = \text{diag}[w(-N), w(-N+1), \ldots, w(0), \ldots, w(N-1), w(N)]$ is the diagonal matrix formed by the adopted window $w(\cdot)$ such as Hann window, and it can improve anti-interference capability. The H(1) to H(4) are the first four elements of the matrix H.

In step 835, the device can calculate the frequency correction and the updated frequency. For example, the device can calculate the frequency correction using the following equation based on the variables calculated in step 830:

$$\Delta f_0 = \frac{H(2) \cdot H(3) - H(1) \cdot H(4)}{2\pi[H(1)^2 + H(2)^2]} \quad (17)$$

Once the frequency correction is calculated, the device can calculate the updated frequency using the following equation:

$$f_0^{(k)} = f_0^{(k-1)} + \Delta f_0$$

where $f_0^{(k)}$ is the fundamental frequency in the kth iteration.

In step 840, the device can determine whether the frequency has been calculated sufficiently. There can be several techniques for making this determination. In one example embodiment, an absolute value of the correction frequency can be compared to the threshold value e, which can be in the order of, e.g., $10^{-6}$. In particular, if $|\Delta f_0| \le \varepsilon$, the device can determine that the frequency has been calculated enough. In another example embodiment, the device can compare the counter k to the minimum and/or maximum number of iterations K specified in step 820. If, e.g., the counter k is greater than the specified number K, the device can determine that the frequency has been calculated enough. In one example embodiment, the device can determine that the frequency has been calculated enough if both of the previous conditions are satisfied.

In this example embodiment, if in step 840 the device determines that the frequency has not been calculated enough, the device can add one increment to the counter value k in step 845 and repeat the steps 830-840. Otherwise, if in step 840 the device determines that the frequency has been calculated sufficiently, the device can proceed to step 850.

In step 850, using the updated frequency, the device can calculate an updated phasor. In one example embodiment, the updated phasor can be calculated using the following equation:

$$\dot{X} = H(1) - jH(2) = a_0 \cos\varphi_0 + ja_0 \sin\varphi_0 \quad (18)$$

where $a_0$ is the polynomial coefficient and $\varphi_0$ is the initial phase. See equation (1).

In step 860, the updated frequency and the updated phasor can be provided to a quality control module. The module can also receive the test signal associated with the updated phasor and the updated frequency. The module can calculate a "transient monitor" which can represent the quality of the measured phasor. The "transient monitor" can be expressed as:

$$E_{res} = \sum_{i=0}^{2N} |x(i) - \hat{x}(i)| \quad (34)$$

where $E_{res}$ denotes the "transient monitor", x(i) are the sampled values, and $\hat{x}(i)$ are the estimated values, obtained by:

$$\hat{x}(i) = \sqrt{2}\hat{X}_m \cos(2\pi\hat{f}_0 t_i + \hat{\varphi}_0) \quad (35)$$

where $\hat{X}_m$, $\hat{f}_0$ and $\hat{\varphi}_0$ are the measured amplitude, frequency and initial phase.

In step 870, the device can determine whether a step has occurred. A step indicates a sudden increase or decrease in the value of, e.g., amplitude or phase of the updated phasor. A step can be a local maximum or minimum. For example, using the "transient monitor," the device can determine whether there is an amplitude step or a phase step and the time $t_s$ when the step occurred. If there is a determination that no step has occurred, then the device can proceed to step 880 where ROCOF can be calculated. Otherwise, a post-processing adjustment will be implemented in step 875.

In step 875, the phasor and the frequency values are recalculated using the unfiltered test signals in the time range $[t_s-T_F, t_s+T_F]$, and replace the updated phasor and updated frequency values obtained by the filtered test signals. $T_F$ represents the filter length. This recalculation could be done by repeating the steps 820-850 for the unfiltered test signals.

In one example embodiment, the phasor estimation window length TL can influence the phasor and frequency values. To eliminate this influence, the estimation time range can be divided into two ranges: $[t_s-T_L, t_s]$ and $[t_s, t_s+T_L]$. In $[t_s-T_L, t_s]$ range, the phasor and frequency values can be adjusted by following the steps 820-850 for the unfiltered test signals. However, the phasor and frequency values remain the same (i.e., updated phasor and updated frequency) for the $[t_s, t_s+T_L]$ range.

In step 880, the updated phasor and the updated frequency values (or the adjusted phasor and the adjusted frequency values) can be used to calculate ROCOF. In one example embodiment, ROCOF can be calculated using the following formula:

$$\hat{rf}_c(k) = \hat{rf}(k) - 2.85 \times 10^{-5} c_2(k) \quad (36)$$

where $$\hat{rf}(k) = \sum_{i=0}^{M} q_{1i} f(k - M/2 + i) \quad (26)$$

$$c_2(k) = \sum_{i=0}^{M} q_{2i} \hat{rf}(k - M/2 + i) \quad (37)$$

where $q_{1i}$ and $q_{2i}$ are the filter coefficients obtained by the least square method, f(k) is the estimated fundamental frequency, and M is the filter order.

B. Hardware Implementation

Figure 9:
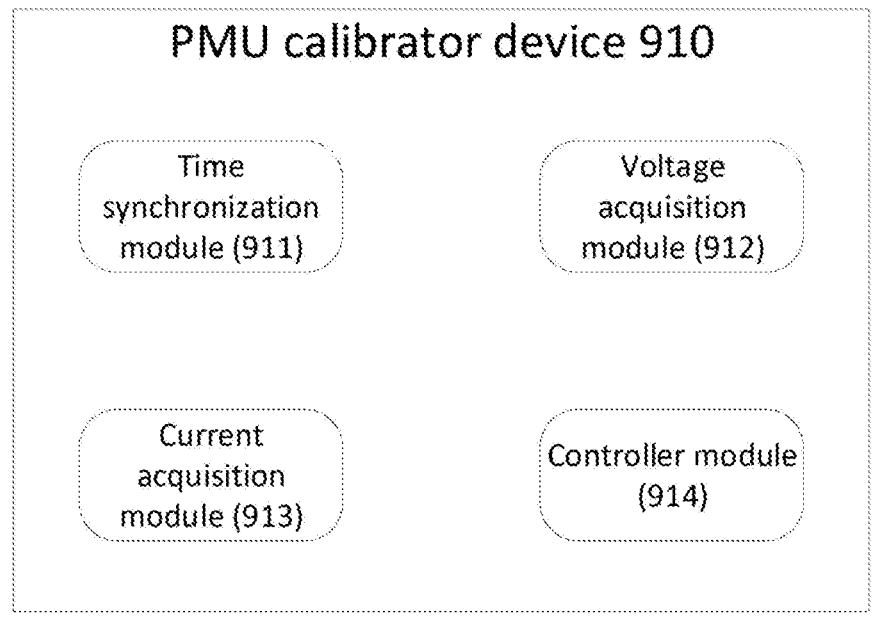
FIG. 9 shows an example PMU calibrator device according to an example embodiment.

FIG. 9 shows an example PMU calibrator device according to an example embodiment. In this example embodiment, the PMU calibrator device 910 consists of a time synchronization module 911, a voltage acquisition module 912, a current acquisition module 913, and a controller module 914. In one example embodiment, equipment from National Instruments (NI) can be used to create the PMU calibrator device. For example, a C-Series Synchronization Module (e.g., NI 9467), a C-Series Voltage Input Module (e.g., NI 9244), a C-Series Current Input Module (e.g., NI 9246), and a CompactRIO Controller (e.g., NI cRIO 9039) from National Instruments (NI) can be selected as calibrator hardware.

NI 9467 is a synchronous timing board that can receive GPS signals and send one pulse per second (PPS) to generate a 10 kHz sample clock. NI 9244 is a voltage acquisition board with a ±400 V input range and 4 channels: NI 9246 is a current acquisition board with a ±20 A input range and 3 channels. NI 9244 and 9246 are 24-bit A/D converters and have a maximum sampling frequency of 50 kHz. Due to the 50th harmonic (2500 Hz), which is the maximum order defined in the IEEE Std., NI 9244 and 9246 meet signal acquisition demands. NI cRIO 9039 is a real-time embedded controller with 2 GB RAM and a 1.91 GHz processor. It has eight extended slots to install boards and a built-in FPGA terminal to process sampled data rapidly. The measurement method was programmed into the controller to estimate the phasor, frequency, and ROCOF, completing the PMU calibrator. The methods of this disclosure can converge after two or three iterations, and the hardware processor performance is high. Therefore, the PMU calibrator can run the estimation program in real time to obtain phasor, frequency and ROCOF.

Accuracy Performance Analysis

A. Hardware Test and Calibration

1. Sampling Module

Figure 10:
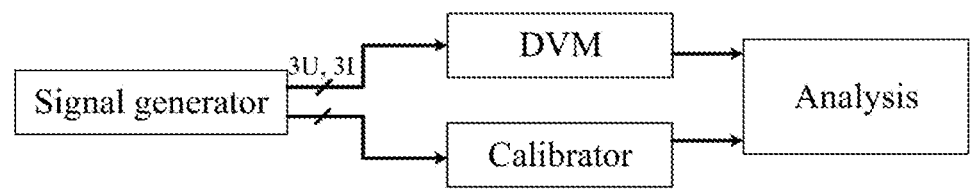
FIG. 10 shows an example amplitude precision test setup.

The sampling module can be taken as a digital filter, and the measurement bandwidth is 45 Hz~55 Hz. Therefore, the sampling module precision can be analyzed by establishing its spectrum characteristic in the mentioned bandwidth.

a) Amplitude-Frequency Characteristic:

FIG. 10 shows an example amplitude precision test setup. In this example test setup, the digital voltmeter (DVM) is a traceable meter, a FLUKE 8508A, and its precision is greater than 100 ppm. The generator sends pure sinusoidal signals from 45 Hz to 55 Hz and at intervals of 0.5 Hz. The calibrator uses the method described herein to estimate the signal amplitude, and then the results were compared with those from DVM.

Figure 11:
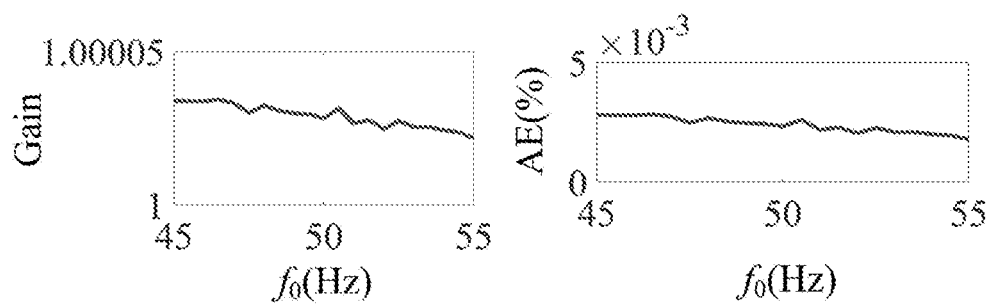
FIG. 11 shows amplitude characteristic of an example sampling module.
Figure 12:
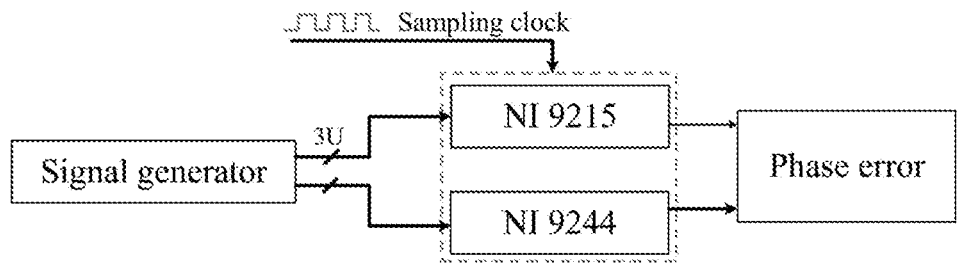
FIG. 12 shows input delay and phase shift test setup according to an example embodiment.

FIG. 11 shows amplitude characteristic of sampling module in 45 Hz~55 Hz. In this example, the sampling module gain is about 1.00003, causing 0.003% in AE. Due to the closely flat amplitude characteristic from 45 Hz to 55 Hz, the measured phasor can be divided by 1.00003 to correct the errors caused by the sampling modular.

b) Phase-Frequency Characteristic:

The ADC phase shift may cause the delay of input signals and phase measurement errors. FIG. 12 shows input delay and phase shift test setup according to an example embodiment. Here, the phase-frequency characteristic was verified in FIG. 12, where NI 9215 is a sampling module with ±10V input range. The NI 9215 can be treated as a reference source because it has a 4.4 μs input delay unrelated to signal frequency and sampling frequency.

Figure 13:
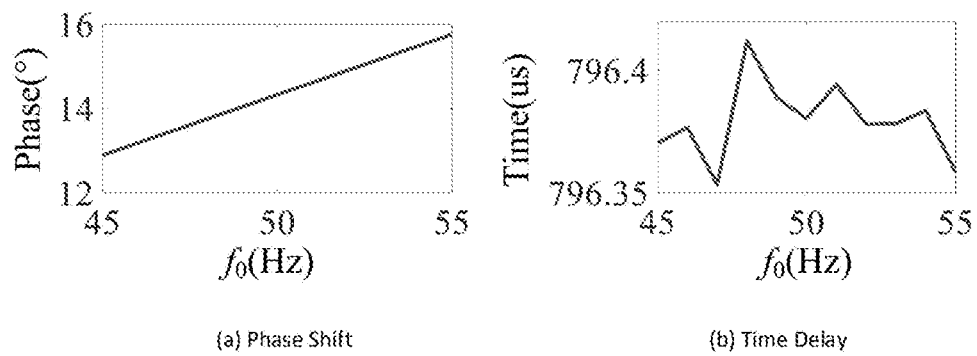
FIG. 13 shows the phase characteristic of an example sampling module.

FIG. 13 shows the phase characteristic of a sampling module in 45 Hz~55 Hz. NI 9215 and NI 9244 (sampling module) have the same sampling clock, and their phase differences and corresponding time delay are shown in FIG. 13 for the input signals of different frequencies. The sampling module has a linear phase with frequency, but the time delay is nearly 796.38 μs according to (38). Thus, the sampling module must be controlled to start sampling 800.78 μs (4.4 μs+796.38 μs) before the pulse per second (PPS) to ensure the phase accuracy.

$$2\pi \times f_0 \times \Delta t = \Delta \varphi \quad (38)$$

where $\Delta t$ is the time delay and $\Delta \varphi$ is the phase difference.

2. Timing Mobile

Figure 14:
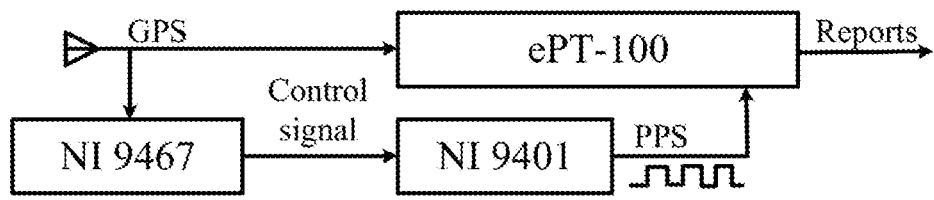
FIG. 14 shows an example timing accuracy test setup.

FIG. 14 shows an example timing accuracy test setup for NI 9467. In this example embodiment, the ePT-100 is Precision Time Test Set from KYLAND which has a synchronization precision of less than 30 ns. Since NI 9467 cannot output an analog PPS signal directly, thus a NI 9401 was used to generate PPS according to the control signal from NI 9467. The PPS was sent into ePT-100, and then the timing uncertainty of NI 9467 was reported. Note that the NI 9401 has 200 ns output delay which must be removed.

Figure 15:
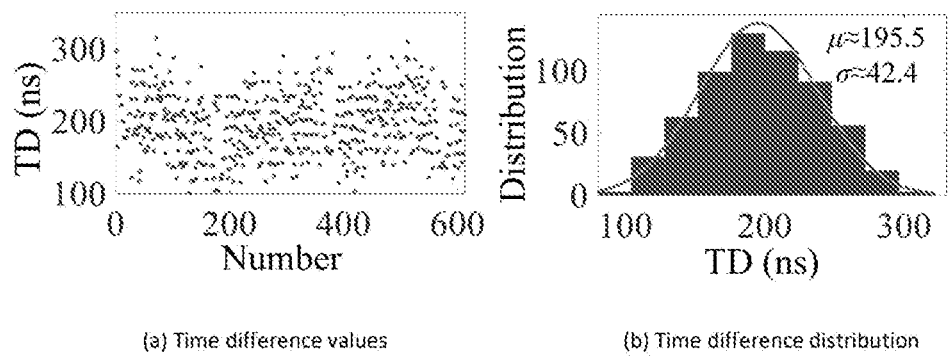
FIG. 15 shows an example time difference for a module.

FIG. 15 shows the time difference of NI 9467 and its distribution. Here, TD stands for time difference. It can be seen that the NI 9467 has a mean $\mu \approx 195.5$ ns and standard deviation $\sigma \approx 42.4$ ns normal distribution characteristic. The offset 195.5 ns can be compensated by changing the position of sampling clocks, and thus the maximum time difference after subtracting the mean value is less than 120 ns which is equivalent to 0.002°. Therefore, the timing accuracy can meet the calibration requirements (0.02°).

B. Algorithm Performance Verification

In one example embodiment, TVE, AE, PE, FE and RFE are used to evaluate PMU measurement performance, and they can be obtained by:

$$TVE = \frac{|X_{th}^{\&} - X_{measured}^{\&}|}{|X_{th}^{\&}|} \times 100\% \quad (39)$$

$$AE = \frac{|X_{th} - X_{measured}|}{X_{th}} \times 100\% \quad (40)$$

$$PE = |\theta_{th} - \theta_{measured}| \quad (41)$$

$$PE = |f_{th} - f_{measured}| \quad (42)$$

$$RFE = |ROCOF_{th} - ROCOF_{measured}| \quad (43)$$

where $X_{th}^{\&}$, $X_{th}$, $\tau_{th}$, $f_{th}$, and $ROCOF_{th}$ are the theoretical values, and $x_{measured}^{\&}$, $X_{measured}$, $\theta_{measured}$, $f_{measured}$, and $ROCOF_{measured}$ are the measured values.

The measured synchrophasor, frequency, and ROCOF under different test conditions were assessed in compliance with the error limits of the M-class PMU in the CHN and IEEE Std. In the following simulation, test signals were generated by MATLAB at $f_s$=10 kHz. The nominal frequency $f_n$ and reporting rate $F_r$ were each 50 Hz. The test conditions combined CHN and IEEE Std. are shown in Table II, where the frequency deviations are ±2.5 Hz under interference and modulation conditions. In addition, the initial phase of each test type varies at intervals of 5° from 0° to 180°, and the test duration of each test case is 10 s.

TABLE II

STATIC AND DYNAMIC TEST CONDITIONS

| Test types | Range of signal parameters |
| --- | --- |
| Off-nominal | $X_m$ = 57.73 V, 45 Hz ≤ $f_0$ ≤ 55 Hz |
| Harmonics | $X_m$ = 57.73 V, $f_0$ = 47.5 Hz, 50 Hz, 52.5 Hz; harmonic magnitude is 0.1$X_m$, frequency is up to 50th |
| Out-of-band (OOB) | $X_m$, = 57.73 V, $f_0$ = 47.5 Hz, 50 Hz, 52.5 Hz; inter-harmonic magnitude is 0.1$X_m$, = frequencies are 10 Hz, 20 Hz, 25 Hz, 75 Hz, 80 Hz and 90 Hz |
| AM + PM | $X_m$ = 57.73 V, $f_0$ = 47.5 Hz, 50 Hz, 52.5 Hz; $k_x$ = 0.1, $k_a$, = 0.1, 0.1 Hz ≤ $f_m$ ≤ 5 Hz |
| Frequency ramp | $X_{01}$ = 57.73 V, $R_f$ ± 1 Hz/s, test duration is 10 s |
| Step | Amplitude step: ±0.1$X_m$, phase step: ±π/18 |

The maximum measurement errors are shown in Tables III and IV The measurement accuracy is at least 80 times better than that in IEEE and CHN Std. under static and dynamic conditions. Since the fundamental frequency is updated by the iterative technique, the method presented in this disclosure is unaffected by the deviated frequency and its errors are close to 0. This method is also unaffected by harmonics or out-of-band interferences, because of the usage of the designed band-pass filter. Due to the post-processing based on "transient monitor," the measurement errors are very small before and after amplitude or phase step, and thus the response and delay time are eliminated. In addition, the ROCOF estimation method improved its accuracy in modulation tests and ensures the validity of the calibration reference values (the uncorrected ROCOF error is 0.35 Hz/s).

TABLE III

MAXIMUM SYNCHROPHASOR ERROR UNDER STATIC AND DYNAMIC CONDITIONS

| Test type | AE(%) | | PE (°) | | TVE (%) | |
|---|---|---|---|---|---|---|
| | Proposed | CHN | Proposed | CHM | Proposed | IEEE |
| Off-nominal | $1.6 \times 10^{-12}$ | 0.2 | $1.2 \times 10^{-12}$ | 0.2 | $2.1 \times 10^{-11}$ | 1 |
| Harmonic | $7.0 \times 10^{-8}$ | 0.4 | $4.8 \times 10^{-8}$ | 0.4 | $8.2 \times 10^{-8}$ | 1 |
| OOB | $9.8 \times 10^{-7}$ | 0.5 | $6.8 \times 10^{-7}$ | 1 | $1.2 \times 10^{-6}$ | 1.3 |
| AM + PM | $2.6 \times 10^{-3}$ | 0.2 | $2.0 \times 10^{-3}$ | 0.5 | $3.6 \times 10^{-3}$ | — |
| Frequency ramp | $4.2 \times 10^{-6}$ | 0.2 | $2.8 \times 10^{-6}$ | 0.5 | $3.2 \times 10^{-6}$ | 1 |
| Step | $5.5 \times 10^{-13}$ | 0.2 | $1.1 \times 10^{-12}$ | 0.2 | $2.0 \times 10^{-11}$ | 1 |

TABLE IV

MAXIMUM FE AND RFE UNDER STATIC AND DYNAMIC CONDITIONS

| Test type | FE (Hz) | | | RFE (Hz/s) | | |
|---|---|---|---|---|---|---|
| | Proposed | CHN | IEEE | Proposed | CHN | IEEE |
| Off-nominal | $7.1 \times 10^{-13}$ | 0.002 | 0.005 | $3.8 \times 10^{-11}$ | 0.01 | 0.1 |
| Harmonic | $4.4 \times 10^{-8}$ | 0.004 | 0.025 | $4.0 \times 10^{-6}$ | 0.02 | — |
| OOB | $2.6 \times 10^{-7}$ | 0.025 | 0.01 | $3.8 \times 10^{-5}$ | — | — |
| AM + PM | $5.4 \times 10^{-4}$ | 0.3 | — | $2.9 \times 10^{-2}$ | 3 | — |
| Frequency ramp | $8.0 \times 10^{-7}$ | 0.01 | 0.01 | $4.5 \times 10^{-7}$ | 0.2 | 0.2 |
| Step | $6.0 \times 10^{-13}$ | 0 025 | 0.005 | $2.5 \times 10^{-11}$ | 0.1 | 0.1 |

Figure 16:
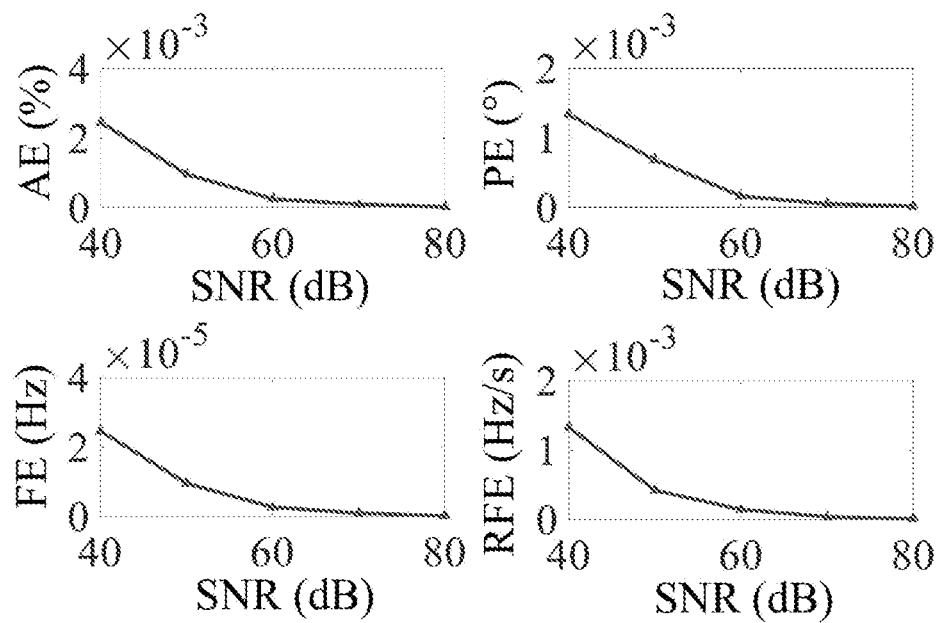
FIG. 16 displays example measurement errors of different white noise levels.

FIG. 16 displays the measurement errors of different white noise levels from 40 dB to 80 dB. In this example, SNR is signal to noise ratio. The noises are superimposed on steady-state signal. With the decrease of SNR, the measurement errors become larger. However, the maximum errors (AE: 0.0025%, PE: 0.0014°, FE: $2.5 \times 10^{-5}$ Hz, and RFE: 0.0014 Hz/s) are still 7 times lower than the requirements listed in Table III and IV, where the error limitations are for the tests without noise. Therefore, the proposed method has a good anti-noise performance.

C. Experimental Testing

1. PMU Calibrator Test Setup

To verify the measurement accuracy of the proposed PMU calibrator, a high-accuracy signal generator (Omicron CMC256-plus) calibrated by high-precision DVM and oscilloscope was used as the reference generator. The computer controlled the signal generator to send out test signals and produced reference measurements according to the test signal mathematical model. The generated test signals' mathematical models are defined in CHN and IEEE Std., and reference phasor, frequency, and ROCOF are derived from them. Then, the calibrator sampled the test signals and estimated the measurements. Finally, the measurement accuracy was obtained by comparing the reference and measured measurements. The signal generator and calibrator were synchronized with GPS.

Different phasor models can be established for different signal types and model parameters can be solved based on Levenberg-Marquard (LM) algorithm (M1). Unlike M1, (M2) can be used in a PMU calibrator. In addition, the methods of the present disclosure can be improved based on AM model method. Therefore, these three algorithms were compared to verify the measurement accuracy of the built PMU calibrator. Note that all methods estimated the test signals filtered by the designed bandpass filter.

2. Single Tests

The single tests were used to verify the PMU calibrator accuracy in the test types laid down in IEEE and CHN Std. The measurement performance of the calibrator is listed in Tables V and VI. Due to the existence of hardware error and random noise, the measurement errors became larger, but the calibrator accuracy was at least 30 times better than the evaluation indicators in CHN Std. Therefore, in one example embodiment, the calibrator can be applied to laboratory calibrating and testing of DUT in China. Different from other tests, in one example embodiment, it is recommended to use an "equivalent time sampling" approach to perform step tests.

Figure 17:
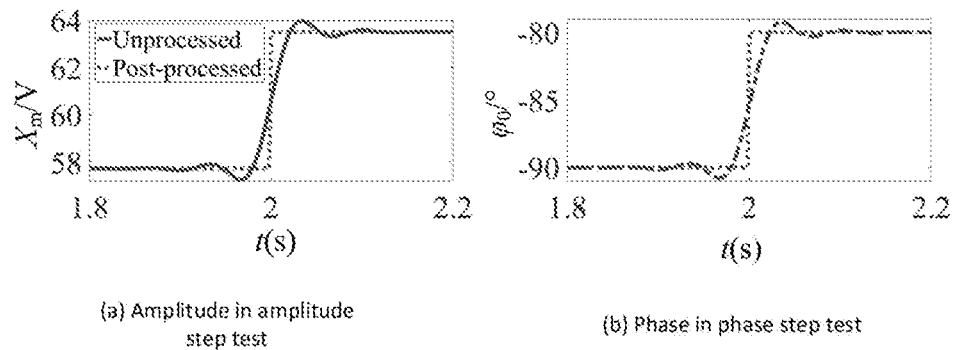
FIGS. 17 and 18 show amplitude and phase step tests.
Figure 18:
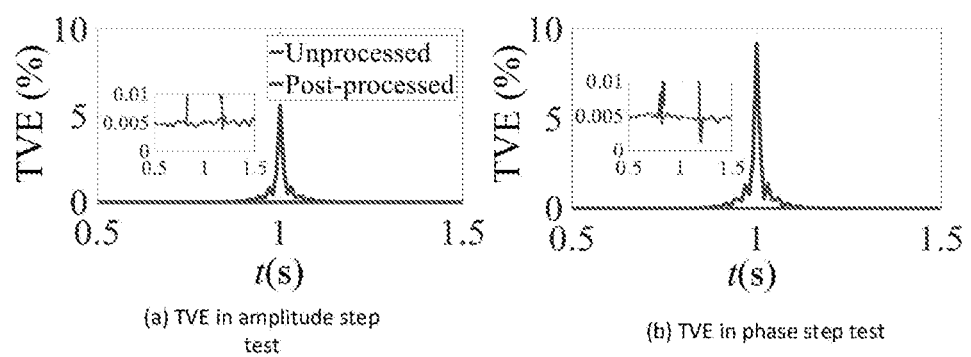

FIGS. 17 and 18 show amplitude and phase step tests. The "transient monitor" was used to monitor the step process, and then the initial measurements were post-processed, causing the fluctuations during transient conditions to be eliminated. In FIG. 18, TVE decreased to 0.005% with post-processing during the step processes, indicating no response time and delay time. As a result, the estimation results can be taken as reference values to evaluate the measurement performance of PMUs in step tests.

TABLE V

MAXIMUM SYNCHROPHASOR ERROR UNDER STATIC AND DYNAMIC CONDITIONS

| Test type | AE (%) | | PE (°) | | TVE (%) | |
|---|---|---|---|---|---|---|
| | Proposed | CHN | Proposed | CHN | Proposed | IEEE |
| Off-nominal | $4.1 \times 10^{-3}$ | 0.2 | $2.3 \times 10^{-3}$ | 0.2 | $6.0 \times 10^{-3}$ | 1 |
| Harmonic | $2.9 \times 10^{-3}$ | 0.4 | $4.2 \times 10^{-3}$ | 0.4 | $7.6 \times 10^{-3}$ | 1 |
| OOB | $2.8 \times 10^{-3}$ | 0.5 | $4.5 \times 10^{-3}$ | 1 | $8.2 \times 10^{-3}$ | 1.3 |
| AM + PM | $3.9 \times 10^{-3}$ | 0.2 | $2.9 \times 10^{-3}$ | 0.5 | $5.3 \times 10^{-3}$ | — |
| Frequency ramp | $4.2 \times 10^{-3}$ | 0.2 | $2.4 \times 10^{-3}$ | 0.5 | $5.5 \times 10^{-3}$ | 1 |

TABLE VI

MAXIMUM FE AND RFE UNDER STATIC AND DYNAMIC CONDITIONS

| Test type | FE (Hz) | | | RFE (Hz/s) | | |
|---|---|---|---|---|---|---|
| | Proposed | CHN | IEEE | Proposed | CHN | IEEE |
| Off-nominal | $8.0 \times 10^{-6}$ | 0.002 | 0.005 | $2.2 \times 10^{-4}$ | 0.01 | 0.1 |
| Harmonic | $5.6 \times 10^{-6}$ | 0.004 | 0.025 | $3.4 \times 10^{-4}$ | 0.02 | — |
| OOB | $9.7 \times 10^{-6}$ | 0.025 | 0.01 | $8.6 \times 10^{-4}$ | — | — |
| AM + PM | $5.6 \times 10^{-4}$ | 0.3 | — | $3.2 \times 10^{-2}$ | 3 | — |
| Frequency ramp | $3.0 \times 10^{-6}$ | 0.01 | 0.01 | $1.6 \times 10^{-4}$ | 0.2 | 0.2 |

Tables VII and VIII show the measurement errors of different algorithms in off-nominal and modulation tests. Note that the frequency and ROCOF estimation method are not provided by M1, and the ROCOF estimation method are not presented in M2. Although M1 established different fitting models for different test signals, M1 and the methods of the present disclosure still have a small difference for synchrophasor under static and dynamic conditions in a real hardware system. M2 can meet the early calibration requirements (4:1) for dynamic tests, but its errors are too large to satisfy the latest standard (10:1). The AM model method has a good performance in modulation tests, but its measurement errors become larger for the large frequency deviation from the nominal frequency.

TABLE VII

MAXIMUM MEASUREMENT ERRORS IN OFF-NOMINAL TEST

| Method | AE (%) | PE (°) | TVE (%) | FE (Hz) | RFE (Hz/s) |
|---|---|---|---|---|---|
| M1 | 0.007 | 0.002 | 0.009 | — | — |
| M2 | 0.084 | 0.060 | 0.135 | 0.013 | — |
| AM | 0.062 | 0.015 | 0.076 | 0.002 | 0.115 |
| Proposed | 0.004 | 0.003 | 0.006 | $8.0 \times 10^{-6}$ | $2.2 \times 10^{-4}$ |
| CHN | 0.2 | 0.2 | — | 0.002 | 0.01 |
| IEEE | — | — | 1 | 0.005 | 0.1 |

TABLE VIII

MAXIMUM MEASUREMENT ERRORS IN AM + PM TEST

| Method | AE (%) | PE (°) | TVE (%) | FE (Hz) | RFE (Hz/s) |
|---|---|---|---|---|---|
| M1 | 0.008 | 0.006 | 0.012 | — | — |
| M2 | 0.034 | 0.035 | 0.068 | 0.021 | — |
| AM | 0.027 | 0.011 | 0.031 | 0.019 | 0.378 |
| Proposed | 0.004 | 0.003 | 0.006 | $5.6 \times 10^{-4}$ | 0.032 |
| CHN | 0.2 | 0.5 | — | 0.3 | 3 |
| IEEE | — | — | 3 | 0.3 | 14 |

3. Combined Tests

Except the above signals laid down in PMU standards, the real power signal contents are more complex, and the deployed PMUs must still measure phasors accurately. Therefore, in one example embodiment, the PMU calibrator needs to provide reference values to test the measurement performance of DUT for combined signals.

a) Multiple Interference Signals:

In a power system, DC decaying component, harmonics and inter-harmonics may exist in voltage or current signals. Additionally, the magnitude of interference signals can be up to 40% of the fundamental frequency. As shown in Table IX, the designed band-pass filter has a good suppression on interference signals, and the measurement accuracy is about 10 times better than the requirements for harmonics and OOB tests.

TABLE IX

MAXIMUM MEASUREMENT ERRORS IN MULTIPLE INTERFERENCE TEST

| | AE (%) | PE (°) | TVE (%) | FE (Hz) | RFE( Hz/s) |
|---|---|---|---|---|---|
| Proposed | 0.003 | 0.002 | 0.004 | $2.2 \times 10^{-5}$ | 0.002 |
| Test conditions | \multicolumn{5}{l}{Harmonic: $2^{nd} \sim 25^{th}$, $0.4X_m$ for $2^{nd}$ and $0.05X_{50}$ for others; Inter-harmonic $0.2X_m$, for 20 Hz and 80 Hz, and $0.05X_m$ for 10 Hz and 90 Hz; A DC decaying component (dc magnitude is $0.1X_m \sim 1.2X_m$ and dc time constant is 0.1 s~2.0 s); $f_0$ is 47.5 Hz or 52.5 Hz} | b) Multiple Mode Power Oscillation:

In a real power system, there are multiple oscillation frequencies and the fundamental frequency may offset from the nominal frequency. Table X lists the maximum errors of different exemplary methods. Compared with M2 and AM model method, the methods of the present disclosure have a better measurement performance and its accuracy is at least one order of magnitude better than the requirements for modulation tests in CHN Std.

TABLE X

MAXIMUM MEASUREMENT ERRORS IN MODULATION TEST

| | AE (%) | PE (°) | TVE (%) | FE (Hz) | RFE (Hz/s) |
|---|---|---|---|---|---|
| M2 | 0.173 | 0.097 | 0.171 | 0.034 | — |
| AM | 0.089 | 0.075 | 0.135 | 0.028 | 0.786 |
| Proposed | 0.011 | 0.014 | 0.027 | 0.004 | 0.194 |
| Test conditions | \multicolumn{5}{l}{When $f_m$ is 1 Hz, $k_x = 0.1X_{50}$ and $k_p = 0.1$ rad; When $f_{50}$, is 3 Hz, $k_x = 0.2X_m$, and $k_p = 0.2$ rad; When $f_m$ is 5 Hz, $k_x = 0.3X_m$ and $k_p$, = 0.3 rad; $f_0$ = 49.5 Hz or 50.5 Hz; Modulation initial phase varies from 0° to 180°} |

Technical Implementation of a Controller

Figure 19:
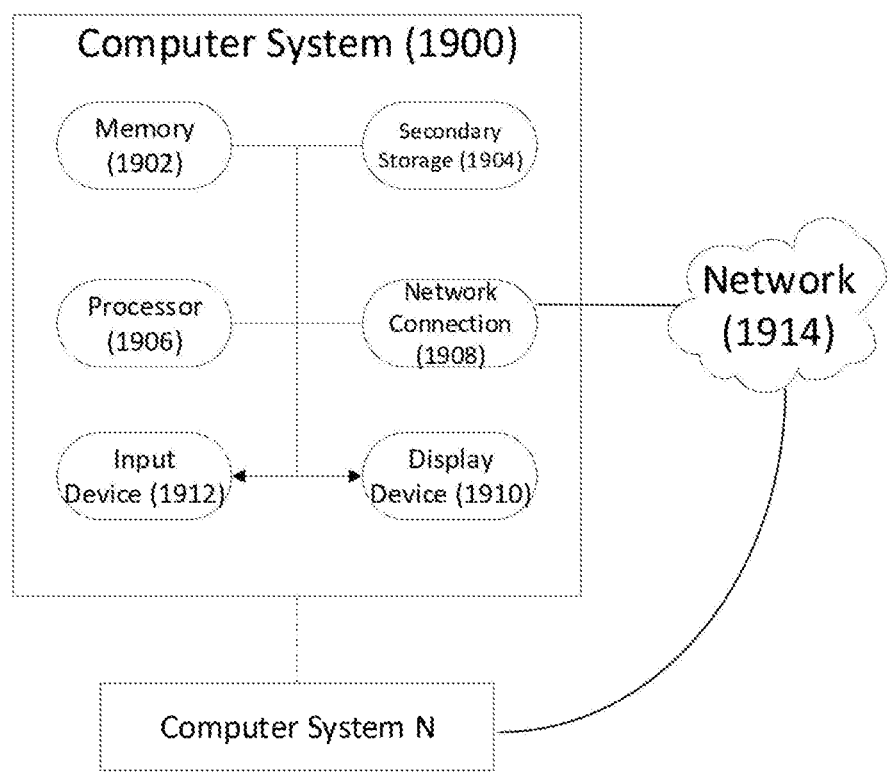
FIG. 19 illustrates exemplary hardware components for a controller.

FIG. 19 illustrates exemplary hardware components of a controller. A computer system 1900, or other computer systems similarly configured, may include and execute one or more subsystem components to perform functions described herein, including the steps of various flow processes described above. Likewise, a mobile device, a cell phone, a smartphone, a laptop, a desktop, a notebook, a tablet, a wearable device, a server, etc., which includes some of the same components of the computer system 1900, may run an application (or software) and perform the steps and functionalities described above. Computer system 1900 may connect to a network 1914, e.g., Internet, or other network, to receive inquiries, obtain data, and transmit information and incentives as described above.

The computer system 1900 typically includes a memory 1902, a secondary storage device 1904, and a processor 1906. The computer system 1900 may also include a plurality of processors 1906 and be configured as a plurality of, e.g., bladed servers, or other known server configurations. The computer system 1900 may also include a network connection device 1908, a display device 1910, and an input device 1912.

The memory 1902 may include RAM or similar types of memory, and it may store one or more applications for execution by processor 1906. Secondary storage device 1904 may include a hard disk drive, floppy disk drive, CD-ROM drive, or other types of non-volatile data storage. Processor 1906 executes the application(s), such as those described herein, which are stored in memory 1902 or secondary storage 1904, or received from the Internet or other network 1914. The processing by processor 1906 may be implemented in software, such as software modules, for execution by computers or other machines. These applications preferably include instructions executable to perform the system and subsystem component functions and methods described above and illustrated in the FIGS. herein. The applications preferably provide graphical user interfaces (GUIs) through which users may view and interact with subsystem components.

The computer system 1900 may store one or more database structures in the secondary storage 1904, for example, for storing and maintaining the information necessary to perform the above-described functions. Alternatively, such information may be in storage devices separate from these components.

Also, as noted, processor 1906 may execute one or more software applications to provide the functions described in this specification, specifically to execute and perform the steps and functions in the process flows described above. Such processes may be implemented in software, such as software modules, for execution by computers or other machines. The GUIs may be formatted, for example, as web pages in HyperText Markup Language (HTML), Extensible Markup Language (XML) or in any other suitable form for presentation on a display device depending upon applications used by users to interact with the computer system 1900.

The input device 1912 may include any device for entering information into the computer system 1900, such as a touch-screen, keyboard, mouse, cursor-control device, microphone, digital camera, video recorder or camcorder. The input and output device 1912 may be used to enter information into GUIs during performance of the methods described above. The display device 1910 may include any type of device for presenting visual information such as, for example, a computer monitor or flat-screen display (or mobile device screen). The display device 1910 may display the GUIs and/or output from sub-system components (or software).

Examples of the computer system 1900 include dedicated server computers, such as bladed servers, personal computers, laptop computers, notebook computers, palm top computers, network computers, mobile devices, or any processor-controlled device capable of executing a web browser or other type of application for interacting with the system.

Although only one computer system 1900 is shown in detail, system 1900 may use multiple computer systems or servers as necessary or desired to support the users and may also use back-up or redundant servers to prevent network downtime in the event of a failure of a particular server. In addition, although computer system 1900 is depicted with various components, one skilled in the art will appreciate that the system can contain additional or different components. In addition, although aspects of an implementation consistent with the above are described as being stored in a memory, one skilled in the art will appreciate that these aspects can also be stored on or read from other types of computer program products or computer-readable media, such as secondary storage devices, including hard disks, floppy disks, or CD-ROM; or other forms of RAM or ROM. The computer-readable media may include instructions for controlling the computer system 1900, to perform a particular method, such as methods described above.

The present disclosure is not to be limited in terms of the particular embodiments described in this application, which are intended as illustrations of various aspects. Many modifications and variations can be made without departing from its spirit and scope, as may be apparent. Functionally equivalent methods and apparatuses within the scope of the disclosure, in addition to those enumerated herein, may be apparent from the foregoing representative descriptions. Such modifications and variations are intended to fall within the scope of the appended representative claims. The present disclosure is to be limited only by the terms of the appended representative claims, along with the full scope of equivalents to which such representative claims are entitled. It is also to be understood that the terminology used herein is for the purpose of describing particular embodiments only, and is not intended to be limiting.

What is claimed is:

1. A method for estimating a fundamental phasor and frequency values for a phasor measurement unit calibrator based on a general signal-fitting model, the method comprising:

establishing a three-order polynomial fitting model representing a dynamic change of phasor in a short data window, wherein the three-order polynomial fitting model contains only one non-linear unknown variable;

receiving, at a calibrator device of the phasor measurement unit, unfiltered test signals including static test signals and dynamic test signals from a signal generator, the unfiltered test signals including a voltage signal and a current signal that are synchronized;

applying, using a processor of the calibrator device, a finite impulse response digital band-pass filter with suppression effect on low-frequency interference signals to the unfiltered test signals to obtain filtered test signals;

setting, using the processor, a threshold value $f_0$ for a fundamental frequency, a threshold value $\varepsilon$ for a frequency correction, a threshold value for a maximum number of iterations K, and a counter value k;

calculating (1), using the processor, polynomial coefficients by the weighted least squares (WLS) method:

$$H=(P^T W^T W P)^{-1} P^T W^T W x(t),$$

wherein weighted coefficients W have suppression on high-frequency interference signals;

calculating (2), using the processor, a frequency correction and an updated frequency, wherein the frequency correction is calculated using:

$$\Delta f_0 = \frac{H(2) \cdot H(3) - H(1) \cdot H(4)}{2\pi[H(1)^2 + H(2)^2]},$$

and
the updated frequency is calculated using:

$$f_0^{(k)} = f_0^{(k-1)} + \Delta f_0;$$

determining (3), using the processor, whether the updated frequency has been calculated sufficiently $|\Delta f_0| \leq \varepsilon$, or the counter k is less than the maximum number of iterations K;

in response to a determination that the updated frequency has not been calculated sufficiently, incrementing the counter k by one unit and repeating the calculation and determination steps 1-3;

in response to a determination that the updated frequency has been calculated sufficiently, calculating, using the processor, an updated phasor using:

$$\dot{X}=H(1)-jH(2)=a_0 \cos \varphi_0 + j a_0 \sin \varphi_0$$

wherein $a_0$ is the polynomial coefficient and $\varphi_0$ is an initial phase;

calculating, using the processor, a transient monitor using:

$$E_{res} = \sum_{i=0}^{2N} |x(i) - \hat{x}(i)|$$

wherein $E_{res}$ denotes the transient monitor, $x(i)$ are determined using the filtered test signals, and $\hat{x}(i)$ are determined using the updated phasor by using:

$$\hat{x}(i)=\sqrt{2}\hat{X}_m \cos(2\pi \hat{f}_0 t_i + \hat{\varphi}_0)$$

wherein $\hat{X}_m$, $\hat{f}_0$ and $\hat{\varphi}_0$ are a test signal amplitude, a test signal frequency and a test signal initial phase, respectively;

determining, using the processor, whether a step has occurred in the updated phasor or the updated frequency;

in response to a determination that a step has occurred in the updated phasor or the updated frequency, adjusting, using the processor, the updated phasor and the updated frequency using the unfiltered test signals and executing the calculation and determination steps 1-3 in a time range $[t_s-T_F, t_s+T_F]$, wherein $T_F$ represents a filter length;

calculating, using the processor, an updated ROCOF and a measurement error for the ROCOF; and adjusting the phasor measurement unit using the updated phasor, the updated frequency and the updated ROCOF and the measurement error.

* * * * *